(12) United States Patent
Kim et al.

(10) Patent No.: US 8,834,957 B2
(45) Date of Patent: Sep. 16, 2014

(54) PREPARATION METHOD FOR AN ELECTROCONDUCTIVE PATTERNED COPPER LAYER

(75) Inventors: So-Won Kim, Daejeon (KR); Woo-Ram Lee, Daejeon (KR); Sang-Ho Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 411 days.

(21) Appl. No.: 12/613,360

(22) Filed: Nov. 5, 2009

(65) Prior Publication Data

US 2010/0108366 A1    May 6, 2010

(30) Foreign Application Priority Data

Nov. 5, 2008  (KR) .................. 10-2008-0109265
Oct. 30, 2009  (KR) .................. 10-2009-0104452

(51) Int. Cl.

| | |
|---|---|
| B05D 5/12 | (2006.01) |
| H05K 1/09 | (2006.01) |
| C23C 18/12 | (2006.01) |
| C23C 18/40 | (2006.01) |
| C09D 5/24 | (2006.01) |
| C09D 7/12 | (2006.01) |
| C09D 11/52 | (2014.01) |
| C08K 3/22 | (2006.01) |
| C08K 9/04 | (2006.01) |
| H05K 3/12 | (2006.01) |

(52) U.S. Cl.
CPC ............ *H05K 1/092* (2013.01); *C23C 18/1262* (2013.01); *B05D 5/12* (2013.01); *C23C 18/40* (2013.01); *C23C 18/1295* (2013.01); *C23C 18/127* (2013.01); *C08K 3/22* (2013.01); *C08K 9/04* (2013.01); *C09D 5/24* (2013.01); *C09D 7/1225* (2013.01); *C09D 7/1275* (2013.01); *C09D 7/1283* (2013.01); *C09D 11/52* (2013.01); *H05K 1/097* (2013.01); *H05K 3/1291* (2013.01); *H05K 2203/1126* (2013.01); *H05K 2203/1157* (2013.01)
USPC ........................................................ 427/98.4

(58) Field of Classification Search
CPC .. C23C 18/40; C23C 18/1262; C23C 18/127; C23C 18/1279; C23C 18/1295; H05K 1/092; B05D 5/12
USPC ........................................................ 427/98.4
See application file for complete search history.

(56) References Cited

U.S. PATENT DOCUMENTS 2,304,078 A * 12/1942 Drapeau, Jr. et al. ......... 423/604
3,647,532 A *  3/1972 Friedman et al. ............... 427/79

(Continued)

FOREIGN PATENT DOCUMENTS

| | | |
|---|---|---|
| JP | 2006-093003 A | 4/2006 |
| JP | 2006-096655 A | 4/2006 |

(Continued)

*Primary Examiner* — Brian K Talbot
(74) *Attorney, Agent, or Firm* — Rothwell, Figg, Ernst & Manbeck, P.C.

(57) ABSTRACT

A method for preparing an electroconductive patterned copper layer, comprising mixing copper-based particles with a reducing agent, and then adding a solvent thereto to prepare a reducing agent-containing copper-based particle dispersion solution; printing on or filling in the reducing agent-containing copper-based particle dispersion solution a substrate in a predetermined shape to form a reducing agent-containing copper-based particle patterned layer; and firing the reducing agent-containing copper-based particle patterned layer in the air, which allows forming a patterned copper layer with excellent electric conductivity even in the air, thereby being industrially very useful.

14 Claims, 4 Drawing Sheets

(56) References Cited

U.S. PATENT DOCUMENTS

| | | | |
|---|---|---|---|
| 4,079,156 A * | 3/1978 | Youtsey et al. | 427/98.4 |
| 4,122,232 A * | 10/1978 | Kuo | 428/323 |
| 4,388,347 A * | 6/1983 | Shum et al. | 427/98.4 |
| 2005/0069648 A1* | 3/2005 | Maruyama | 427/379 |
| 2005/0161643 A1* | 7/2005 | Sano et al. | 252/512 |
| 2006/0057502 A1 | 3/2006 | Okada et al. | |
| 2006/0098065 A1 | 5/2006 | Maruyama et al. | |
| 2006/0210705 A1* | 9/2006 | Itoh et al. | 427/96.1 |
| 2008/0011125 A1* | 1/2008 | Shirata et al. | 75/255 |
| 2008/0237851 A1* | 10/2008 | Morita et al. | 257/737 |
| 2011/0262657 A1* | 10/2011 | Pope et al. | 427/540 |

FOREIGN PATENT DOCUMENTS

| | | |
|---|---|---|
| KR | 10-0234170 B1 | 1/2000 |
| KR | 10-2005-0084099 A | 8/2005 |
| KR | 10-2006-0047681 A | 5/2006 |
| KR | 10-2006-0112025 A | 10/2006 |
| WO | 2006/093398 A1 | 9/2006 |

* cited by examiner

PREPARATION METHOD FOR AN ELECTROCONDUCTIVE PATTERNED COPPER LAYER

CROSS REFERENCE TO RELATED APPLICATIONS

This application claims priority from Korean patent application No. 10-2008-0109265 filed on Nov. 5, 2008, and Korean patent application No. 10-2009-0104452 filed on Oct. 30, 2009, all of which are incorporated herein by reference in their entireties for all purposes.

BACKGROUND OF THE INVENTION

1. Field of the Invention

The present invention relates to a preparation method for an electroconductive patterned copper layer such as a copper wiring layer of circuit boards or semiconductor devices or a copper electrode layer of various displays, and a patterned copper layer formed by the method. More particularly, the present invention relates to a preparation method of a patterned copper layer with electric conductivity by firing a copper-based particle patterned layer in the air, and a patterned copper layer formed by the method.

2. Description of the Related Art

Circuit boards, semiconductor devices, and various displays have a patterned layer such as a wiring layer or an electrode layer, which is made of metal such as copper, nickel or silver. In particular, a patterned layer using copper is widely used due to good electric conductivity and low price.

Particularly, copper particles and copper oxide particles such as cuprous oxide may be produced with small diameter in a several nanometer or several micrometer level such that they may form a fine pattern, so they are useful in forming an electroconductive patterned copper layer.

According to conventional methods for forming an electroconductive patterned copper layer using copper-based particles, a copper-based particle dispersion solution obtained by dispersing copper-based particles in a solvent is printed on a substrate surface or filled in through holes of the substrate to form a copper-based particle patterned layer, and then the layer is thermally treated at a high temperature under the inert gas circumstance such as a nitrogen gas environment for firing. Accordingly, among the copper-based particles contained in the copper-based particle patterned layer, copper oxides are reduced into copper and thus connected with each other, and organic substances included in the paste are removed, so an electroconductive patterned copper layer is formed (see Japanese Laid-open Patent Publication No. 2006-93003).

According to such a method for forming a common electroconductive copper-based, it is possible to give a patterned copper layer with good electric conductivity. However, the firing process should be executed under an inert gas circumstance in the industrial aspect, there is needed a device for supplying an inert gas, and also it is required to perform thermal treatment in a space kept with the inert gas atmosphere, which however gives more burdens in aspect of costs.

If the above copper-based particle patterned layer is thermally treated and fired in a atmospheric circumstance, not in an inert gas circumstance, an oxidation reaction occurs to the copper due to the oxygen in the air during the thermal treatment process, which results in bad quality of electric conductivity of the patterned copper layer.

SUMMARY OF THE INVENTION

Therefore, the present invention is directed to providing a preparation method capable of forming a patterned copper layer with excellent electric conductivity though a copper-based particle patterned layer is fired in the atmosphere without providing any device for supplying an inert gas or a space kept with an inert gas environment.

In order to accomplish the above object, the present invention provides a preparation method of an electroconductive patterned copper layer, which includes:

(Step 1) preparing a reducing agent-containing copper-based particle dispersion solution by mixing copper-based particles with a reducing agent and then adding a solvent thereto;

(Step 2) forming a reducing agent-containing copper-based particle patterned layer by printing or filling the reducing agent-containing copper-based particle dispersion solution to a substrate into a predetermined shape; and (Step 3) firing the reducing agent-containing copper-based particle patterned layer in the air.

In the preparation method of an electroconductive patterned copper layer according to the present invention, the copper-based particles may be any one selected from the group consisting of copper particles, cuprous oxide particles, and their mixtures. In aspect of electric conductivity of the patterned copper layer to be formed, a mixture of copper particles and cuprous oxide particles is preferred.

The cuprous oxide particles are preferably cuprous oxide assembly particles, in each of which a plurality of cuprous oxide fine particles with an average diameter of 1 to 100 nm are assembled. At this time, the cuprous oxide assembly particles preferably have an average diameter of 0.1 to 10 μm. A standard deviation of the diameters of the cuprous oxide fine particles is preferably 0 to 10%.

Also, in the preparation method of an electroconductive patterned copper layer according to the present invention, the reducing agent may be $NaBH_4$, hydrazine, ascorbic acid, glucose and ethylene glycol, or their mixtures.

In the preparation method of an electroconductive patterned copper layer according to the present invention, the solvent used for the reducing agent-containing copper-based dispersion solution may be at least one common solvent such as glycerol or terpineol, and it is preferred to use a polar solvent such as glycerol.

The reducing agent added to a copper-based particle dispersion solution according to the present invention reduces copper oxide into copper when a copper-based particle patterned layer is fired in the air, thereby continuously supplying copper at an initial firing stage. Accordingly, the copper is fired faster due to the oxygen in the air than the speed at which copper is oxidized, so a patterned copper layer with excellent electric conductivity may be formed even in the air.

As mentioned above, according to the present invention it is possible to form a patterned copper layer with excellent electric conductivity in the air without using any device for supplying an inert gas or a space kept with the inert gas environment, thereby reducing the cost of production, so the present invention is industrially very useful.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

A preparation method of an electroconductive patterned copper layer according to the present invention is as follows.

First, copper-based particles are mixed with a reducing agent, and then a solvent is added thereto to prepare a reducing agent-containing copper-based particle solution (Step 1).

The copper-based particle may be a copper particle or a copper oxide particle such as a cuprous oxide particle.

Copper particles may be prepared in various known methods such as mechanical grinding, co-precipitation, spraying, sol-gel, and electrolysis. In the present invention, the term 'particle' means all kinds of particles, including flakes and powder, which may be dispersed in a solvent to form a patterned layer.

In addition, various methods have been proposed for making cuprous oxide particles. For example, Japanese Laid-open Patent Publication No. 2006-96655 and Korean Laid-open Patent Publication No. 10-2005-84099 disclose a method for making cuprous oxide fine particles.

In the preparation method of a patterned copper layer according to the present invention, as the copper-based particle, copper particles or copper oxide particles such as cuprous oxide particles may be used in single, but they are more preferably used in mixture. If copper particles and cuprous oxide particles are used in mixture, when firing a copper-based particle patterned layer, the cuprous oxide particles are reduced and fired on the basis of copper particles, thereby enhancing a packing density of the patterned layer and thus improving electric conductivity.

Figure 1:
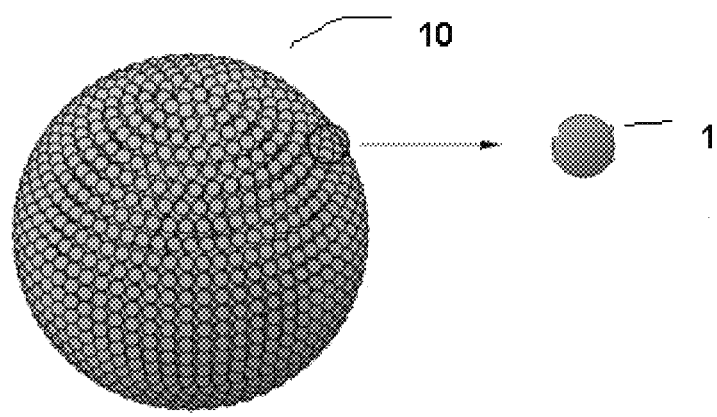
FIG. 1 is a schematic diagram showing an assembly particle of cuprous oxide.

As the cuprous oxide particle, a cuprous oxide assembly particle formed by assembling a plurality of cuprous fine particles with an average diameter of 1 to 100 nm is preferred. If the cuprous oxide assembly particle formed by assembling fine particles is used, a patterned copper layer can be formed faster during laser firing due to a lowered melting point of the cuprous oxide particles. FIG. 1 is a schematic view showing a cuprous oxide assembly particle. Referring to FIG. 1, the cuprous oxide assembly particle 10 is formed by assembling a plurality of cuprous oxide fine particles 1. The cuprous oxide fine particles 1 preferably have an average diameter of 1 to 100 nm. If the average diameter of the cuprous oxide fine particles 1 is less than 1 nm, it is not easy to form the particles.

If the average diameter exceeds 100 nm, inherent properties of the fine particles themselves may be deteriorated. The average diameter of the fine particles 1 is more preferably 1 to 10 nm. In addition, a standard deviation for the diameters of the cuprous oxide fine particles 1 is preferably 0 to 10%. If the standard deviation exceeds 10%, it is not easy to form a cuprous oxide assembly particle with uniform size and shape.

Meanwhile, the cuprous oxide assembly particle 10 preferably has an average diameter of 0.1 to 10 μm. If the average diameter of cuprous oxide assembly particles 10 is less than 0.1 μm, it may be useless to form such an assembly particle. If the average diameter exceeds 10 μm, workability may be deteriorated due to the large size of the assembly particles. The average diameter of the cuprous oxide assembly particles 10 is more preferably 0.3 to 2 The shape of the cuprous oxide assembly particles 10 is not specially limited, but a standard deviation for the diameters of the cuprous oxide assembly particles 10 is preferably 0 to 40%, more preferably 0 to 20%, and it is more preferred as the cuprous oxide assembly particles are closer to a spherical shape. If the standard deviation exceeds 40%, properties may be deteriorated for the patterning during the wiring process due to irregular sizes. In this specification, the spherical shape is defined as including not only a perfect sphere whose aspect ratio is 1 at each section, but also an oval sphere whose aspect ratio is less than 2 at each section.

The cuprous oxide assembly particle, preferably satisfying the above average diameter and the standard deviation, may be prepared in the following way, but not limitedly.

Figure 2:
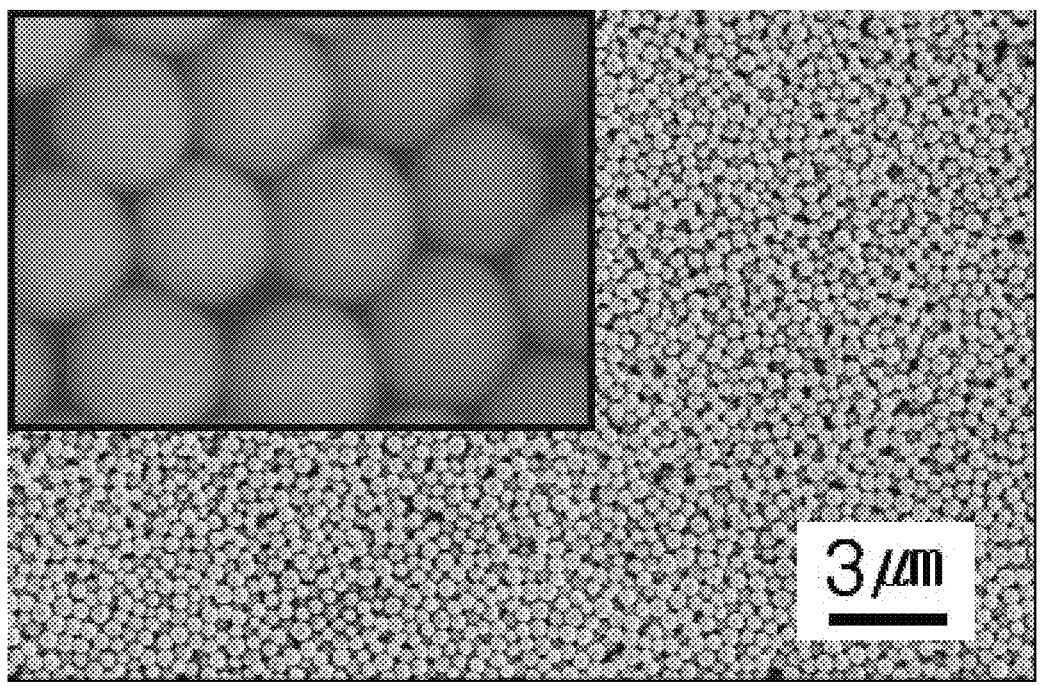
FIG. 2 is a SEM photograph showing a cuprous oxide particle produced according to a composition example.

First, copper carboxyl compound expressed by the following chemical FIG. 1 or carboxyl group-containing compound expressed by the following chemical FIG. 2 are dissolved in a solvent together with copper salt to prepare a copper(II) precursor solution.

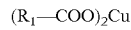

$(R_1—COO)_2Cu$                                  Chemical FIG. 1 where $R_1$ is an alkyl group of $C_1$ to $C_{18}$.

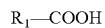

$R_1—COOH$                                       Chemical FIG. 2 where $R_1$ is an alkyl group of $C_1$ to $C_{18}$.

The copper carboxyl compound of the chemical FIG. 1 may be representatively $(CH_3COO)_2Cu$, and the carboxyl group-containing compound of the chemical FIG. 2 may be representative $CH_3COOH$. In addition, the copper salt may be representatively copper nitrate, copper halide, copper hydroxide, and copper sulfate, which may be used in single or in mixture. In addition, the solvent may use any kind of solvent that can allow formation of a cuprous oxide assembly particle when a weak reducing agent is added thereto, as a solvent capable of dissolving the copper carboxyl compound or the carboxyl group-containing compound and the copper salt. For example, the solvent may use water, $C_1$-$C_6$ low alcohol, dimethyl formamide, dimethyl sulfoxide, tetrahydrofuran, acetonitrile, and so on, which may be used in single or in mixture.

Subsequently, a weak reducing agent with a standard reduction potential of −0.2 to −0.05V is added to the prepared copper(II) precursor solution to assemble a plurality of $Cu_2O$ fine particles having an average diameter of 1 to 100 nm with a standard deviation of 0 to 10%, thereby forming spherical $Cu_2O$ assembly particles having an average diameter of 0.1 to 10 μm with a standard deviation of 0 to 40%. Sizes of assembly particles and cuprous oxide fine particles can be controlled by changing reaction conditions such as kind of solvent and addition of surfactant. The weak reducing agent can be put before copper(II) precursors are dissolved in the solvent, and also the weak reducing agent can be dissolved in a separate solvent and then put into the copper(II) precursor solution. The weak reducing agent preferably has a standard reduction potential of −0.2 to −0.05V, which is advantageous in forming the cuprous oxide assembly particles uniformly. This weak reducing agent may use ascorbic acid, diol compound, citric acid, fructose, amine compound, α-hydroxy ketone compound, succinic acid, maltose and so on, which can be used in single or in mixture.

In order to enhance the uniformity of sizes of cuprous oxide assembly particles, it is possible to further add a surfactant to the copper(II) precursor solution. The size of assembly particles may be controlled depending on the kind and dosage of the surfactant, and the added surfactant is present in a state of being formed on the surfaces of the cuprous oxide assembly particles. The surfactant is an amphipathic material having both a hydrophile group and a hydrophobic group in one molecule, and it may adopt a common surfactant used in preparation of cuprous oxide particles. For example, the surfactant may be a single molecule surfactant having at least one functional group selected from the group consisting of —OH, —COOH, —SH and —NH, or a polymer surfactant such as polyacrylamide, polyvinylpyrrolidone, and polyvinylalcohol, and they may be used in single or in mixture. In particular, in case the surfactant is polyacrylamide, the shapes and sizes of obtained cuprous oxide assembly particles become more uniform, so it is possible to obtain spherical cuprous oxide assembly particles whose standard deviation on the diameter is greatly lowered.

If the step of making cuprous oxide assembly particles is completed, the cuprous oxide assembly particles are separated from the solution by means of centrifugal separation or the like to obtain spherical cuprous oxide assembly particles.

Meanwhile, in the preparation method of an electroconductive patterned copper layer according to the present invention, a reducing agent is included in the copper-based particle dispersion solution. When preparing the reducing agent-containing copper-based particle dispersion solution, the reducing agent may be mixed with copper-based particles in advanced and then added to a solvent, or the reducing agent may be added to a solvent after copper-based particles are dispersed in the solvent in advance, and they are all included in the scope of the present invention though an adding order of the reducing agent is different.

When a copper-based particle patterned layer formed using the copper-based particle dispersion solution is fired in the air, the added reducing agent reduces copper oxide into copper, thereby constantly supplying copper at an initial firing stage. Accordingly, the speed at which copper is fired is faster than the speed at this copper is oxidized, so a patterned copper layer with excellent electric conductivity is formed even in the air. An added amount of the reducing agent may be varied depending on the kind of the reducing agent such that the reducing agent may exhibit its function easily, and for example 0.1 to 80 parts by weight of the reducing agent may be added based on 100 parts by weight of the reducing agent-containing copper-based particle dispersion solution. The reducing agent may employ, for example, $NaBH_4$, hydrazine, ascorbic acid, glucose, ethylene glycol and so on, which may be used in single or in mixture, not limitedly. Also, the solvent used for dispersing copper-based particles preferably adopts a common solvent such as glycerol or terpineol, and it is preferred to use a polar solvent such as glycerol in single or to use a polar solvent in mixture with other kinds of solvents.

In the preparation method of an electroconductive patterned copper layer according to the present invention, the reducing agent-containing copper-based particle dispersion solution may be a paste dispersion solution to which a binder resin is further dissolved. The binder resin added to the dispersion solution facilitates easier patterning. The dispersion solution may be further added with nickel or aluminum oxide, serving as a firing-resistant material, as well known in the art.

The reducing agent-containing copper-based particle dispersion solution prepared as mentioned above is printed on or filed in a substrate surface to form a reducing agent-containing copper-based particle patterned layer (Step 2).

The substrate may be any one that requires an electroconductive patterned copper layer such as copper electrodes and copper wirings, and the patterned layer may be formed using any method capable of forming a desired pattern using the copper-based particle dispersion solution such as screen printing, dispensing, ink-jetting, and spraying.

After that, the reducing agent-containing copper-based particle patterned layer is fired in the air (Step 3). Then, copper particles are connected each other, or cuprous oxide particles are converted into copper particles and then connected with each other, thereby forming an electroconductive patterned copper layer.

At this time, the reducing agent contained in the copper-based particle dispersion solution reduces copper oxide generated by oxidation caused by oxygen in the air as explained above, thereby forming a patterned copper layer with an electric conductivity having a sheet resistance of 10.0 Ω/sq, more preferably 1.0 Ω/sg, most preferably 70 mΩ/sq. For the firing process, a well-known thermal treatment process may be used, and for example the thermal treatment may be executed at a temperature of 200 to 650° C. More preferred thermal treatment temperature is 250 to 600° C., and most preferred thermal treatment temperature is 300 to 550° C. The thermal treatment is preferably executed within 10 minutes in aspect of electric conductivity of the obtained patterned copper layer. Meanwhile, instead of the above thermal treatment, it is possible to fire the copper-based particle patterned layer with a strong energy within a short time by irradiating laser thereto, which further prevents oxidization of the copper particles.

Hereinafter, various preferred examples of the present invention will be described in detail for better understandings. However, the examples of the present invention may be modified in various ways, and they should not be interpreted as limiting the scope of the invention. The examples of the present invention are just for better understandings of the invention to persons having ordinary skill in the art.

Example of Composing Cuprous Oxide Assembly Particles 50 mg of $(CH_3COO)_2Cu.H_2O$ and 200 mg of polyacrylamide were dissolved in 4.5 ml of distilled water to prepare a first solution, and 22 mg of ascorbic acid was dissolved in 0.5 ml of distilled water to prepare a second solution. At room temperature and normal pressure and in the air, two solutions were mixed and left fixed for 10 minutes. Subsequently, the mixed solutions were centrifugally separated for 3 minutes at 2000 rpm, and then a supernatant in an upper layer was wasted and the remaining sediment was dispersed again in 20 ml of water. After that, the centrifugal separation was conducted once more to obtain cuprous oxide particles.

Figure 3:
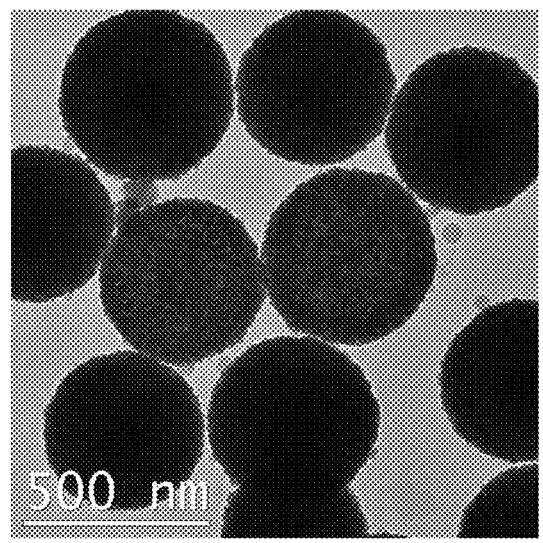
FIG. 3 is a TEM photograph showing the cuprous oxide particle produced according to the composition example.
Figure 5:
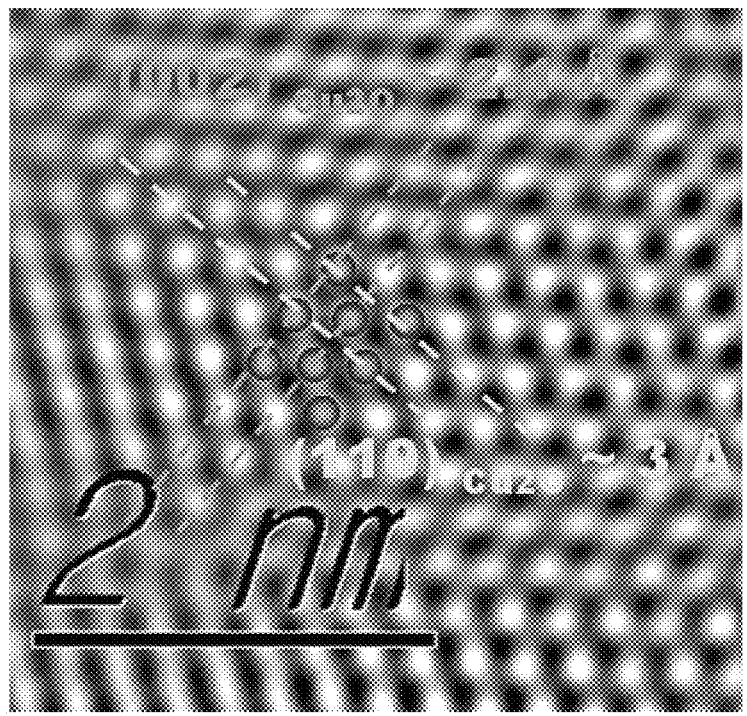
FIG. 5 is a HRTEM photograph for analyzing a structure of the cuprous oxide particle produced according to the composition example.
Figure 6:
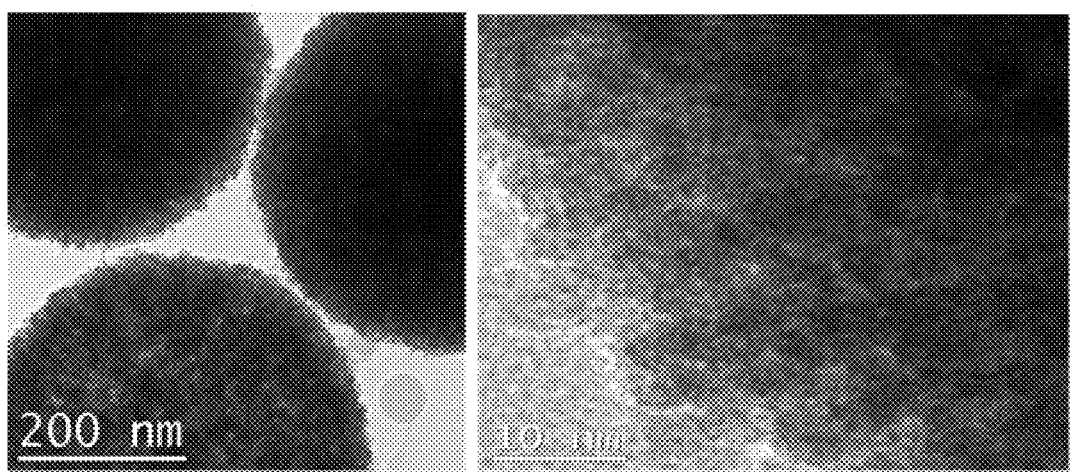
FIG. 6 is a TEM photograph showing a tail portion of the cuprous oxide particle produced according to the composition example.
Figure 7:
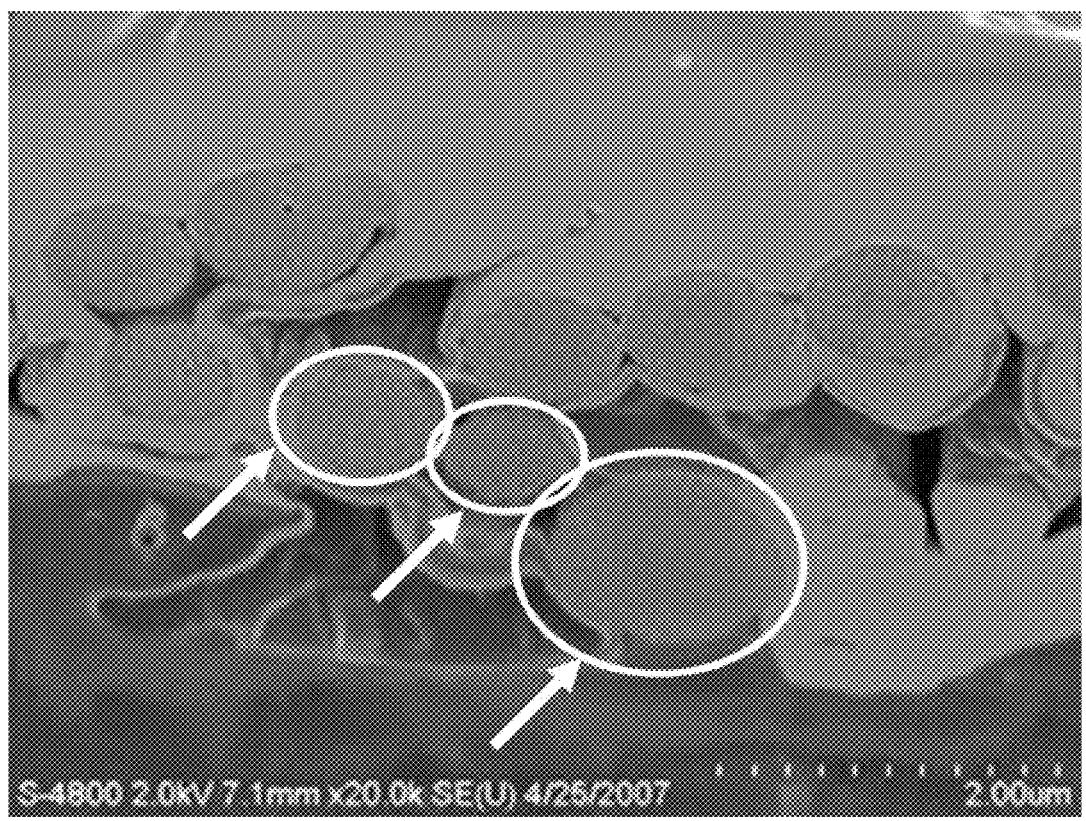
FIG. 7 is a SEM photograph showing a section of the cuprous oxide particle produced according to the composition example, which is cut by FIB.

The cuprous oxide particles are shown in the figures: namely a SEM photograph (see FIG. 2), a TEM photograph (see FIG. 3), an XRD analysis graph (see FIG. 4), a structure analysis photograph of cuprous oxide particles using HRTEM (see FIG. 5), a TEM photograph of a tail portion of cuprous oxide particles (see FIG. 6), and a SEM photograph of a section of cuprous oxide particles cut by FIB (see FIG. 7).

Figure 4:
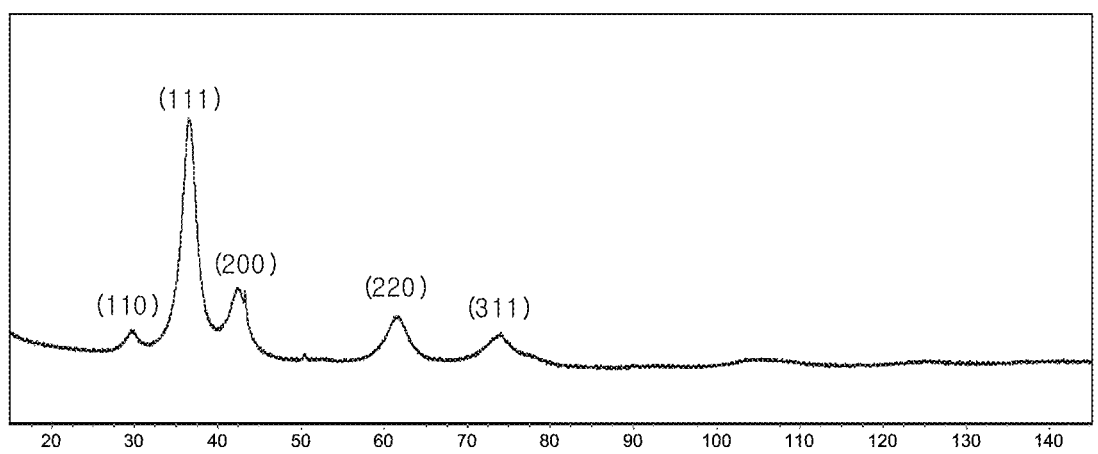
FIG. 4 is a XRD analysis graph of the cuprous oxide particle produced according to the composition example.

According to the Scherrer equation for the XRD pattern of FIG. 4, a crystal size was 4.4 nm, which is identical to a particle size of ~5 nm identified by TEM of FIG. 6.

The size of the formed assembly particles was measured for 200 or more particles using a graphic software (MAC-View) based on the SEM image (see FIG. 2), and the obtained statistical distribution was calculated such that an average size is 504.7 nm and a standard deviation is 91.8 (18%).

Forming Electroconductive Patterned Copper Layer

Example 1

Figure 8:
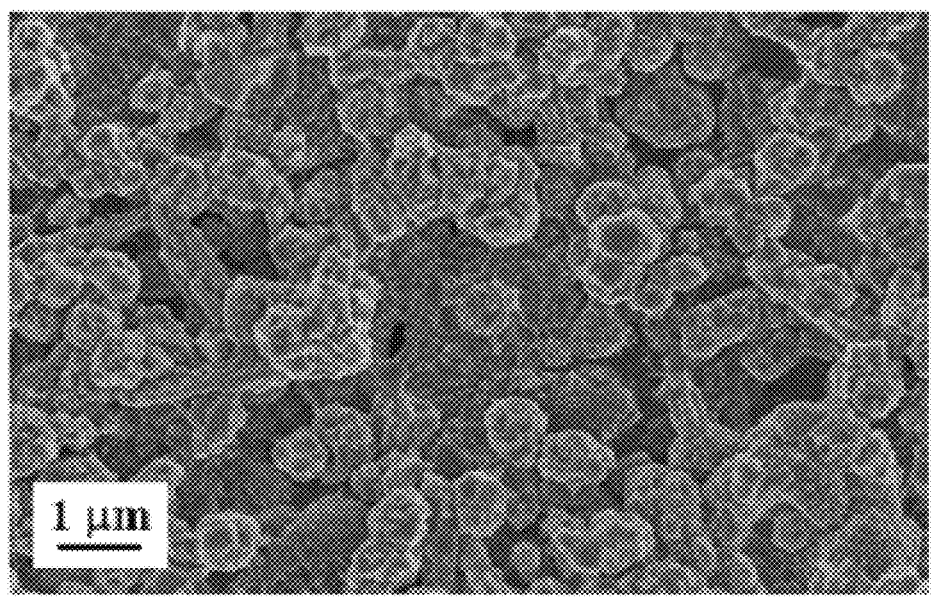
FIG. 8 is a SEM photograph showing an electrically conductive patterned copper layer formed according to an embodiment 1.

4 g of cuprous oxide assembly particles prepared according to the above method were mixed with 2 g of ascorbic acid, and then 2 ml of glycerol was added thereto. The mixture was milled in a 3-roll mill to make a paste. Subsequently, screen printing was conducted to print the paste into a line shape on a substrate, and then the substrate was fired on a hot plate in the air at 500° C. for 1 minute. FIG. 8 is an SEM photograph obtained by taking the electroconductive patterned copper layer formed according to the embodiment 1.

A sheet resistance of the obtained copper line was measured. The measurement result is recorded in the following table 1.

Example 2

4 g of copper flakes with a diameter of about 10 um was mixed with 2 g of ascorbic acid, and then 5 ml of glycerol was added thereto and milled in a 3-roll mill to make a paste. Subsequently, a copper line was made in the same way as the example 1, except that firing was executed at 300° C. for 1 minute.

A measured sheet resistance of the obtained copper line is recorded in the following table 1.

Example 3

A copper line was made in the same way as the example 2, except that 5 ml of terpineol was used instead of 5 ml of glycerol.

A measured sheet resistance of the obtained copper line is recorded in the following table 1.

Example 4

A copper line was made in the same way as the example 3, except that, as the copper-based particles, a mixture of 3.5 g of copper flakes with a diameter of about 10 um and 0.5 g of cuprous oxide assembly particles prepared according to the above composition method was used instead of 4 g of copper flakes of the example 3.

A measured sheet resistance of the obtained copper line is recorded in the following table 1.

Example 5

A copper line was made in the same way as the example 4, except that the firing temperature and the firing time in the air are changed into 450° C. and 90 seconds, respectively.

A measured sheet resistance of the obtained copper line is recorded in the following table 1.

Comparative Example 1

2 ml of a solution obtained by dissolving ethyl cellulose into a 2-butoxyl ethyl acetate/terpineol mixture solvent (2:1) into 10% concentration was added to 2 g of copper flakes with a diameter of about 10 um, and the solution was milled in a 3-roll mill to make a paste. Subsequently, the paste was treated in the same way as in the example 2 to make a copper line.

A measured sheet resistance of the obtained copper line is recorded in the following table 1.

TABLE 1

|  | Sheet Resistance |
| --- | --- |
| Example 1 | 200 mΩ/sq |
| Example 2 | 659.9 mΩ/sq |
| Example 3 | 358.8 mΩ/sq |
| Example 4 | 58.57 mΩ/sq |
| Example 5 | 32.70 mΩ/sq |
| Comparative Example 1 | 3.765 MΩ/sq |

Seeing the table 1, the copper line obtained according to the comparative example 1 exhibits a sheet resistance over 1 million times of the sheet resistances of the copper lines prepared according to the examples by using the reducing agent-containing paste.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A method for preparing an electroconductive patterned copper layer, the method comprising:
   (a) mixing copper-based particles with a reducing agent, and then adding a solvent thereto to prepare a reducing agent-containing copper-based particle dispersion solution consisting of the copper-based particles, the reducing agent, and the solvent;
   (b) printing on or filling in the reducing agent-containing copper-based particle dispersion solution on a substrate in a predetermined shape to form a reducing agent-containing copper-based particle patterned layer; and
   (c) firing the reducing agent-containing copper-based particle patterned layer in air, not in an inert gas atmosphere,
   wherein the reducing agent is included in the content of 0.1 to 80 parts by weight, based on 100 parts by weight of the reducing agent-containing copper-based particle dispersion solution,
   wherein the copper-based particles are cuprous oxide particles or mixtures of copper particles and cuprous oxide particles,
   wherein the reducing agent added to the copper-based particles dispersion solution reduces cuprous oxide into copper when the copper-based particle patterned layer is fired in the air, thereby continuously supplying copper at an initial firing stage,
   wherein the copper is fired faster due to the oxygen in the air than the speed at which copper is oxidized, thereby forming the electroconductive patterned copper layer in the air, and
   wherein the firing is a thermal treatment process performed at 200 to 650° C.

2. The method for preparing an electroconductive patterned copper layer according to claim 1, wherein the cuprous oxide particles are cuprous oxide assembly particles comprising a plurality of cuprous oxide fine particles with an average diameter of 1 to 100 nm.

3. The method for preparing an electroconductive patterned copper layer according to claim 2,
wherein a standard deviation of the diameters of the cuprous oxide fine particles is 0 to 10%.

4. The method for preparing an electroconductive patterned copper layer according to claim 2,
wherein the cuprous oxide assembly particles have an average diameter of 0.1 to 10 μm.

5. The method for preparing an electroconductive patterned copper layer according to claim 2,
wherein the cuprous oxide particles have a surface coated with a surfactant.

6. The method for preparing an electroconductive patterned copper layer according to claim 5,
wherein the surfactant is at least one selected from the group consisting of polyacrylamide, polyvinylpyrrolidone, polyvinylalcohol, and a monomer having at least one functional group selected from the group consisting of —OH, —COOH, —SH and —NH.

7. The method for preparing an electroconductive patterned copper layer according to claim 5,
wherein the surfactant is polyacrylamide.

8. The method for preparing an electroconductive patterned copper layer according to claim 1,
wherein the reducing agent is selected from the group consisting of NaBH4, hydrazine, ascorbic acid, glucose, ethylene glycol and a mixture thereof.

9. The method for preparing an electroconductive patterned copper layer according to claim 1,
wherein the solvent comprises a polar solvent.

10. The method for preparing an electroconductive patterned copper layer according to claim 9,
wherein the polar solvent is glycerol.

11. The method for preparing an electroconductive patterned copper layer according to claim 1,
wherein the solvent comprises terpineol.

12. The method for preparing an electroconductive patterned copper layer according to claim 1,
wherein the electroconductive patterned copper layer has a sheet resistance of 10 Ω/sq or below.

13. The method for preparing an electroconductive patterned copper layer according to claim 1,
wherein the electroconductive patterned copper layer has a sheet resistance of 70 mΩ/sq or below.

14. A method for preparing an electroconductive patterned copper layer, the method comprising:
(a) mixing copper-based particles with a reducing agent, and a binder resin and then adding a solvent thereto to prepare a reducing agent-containing copper-based particle dispersion solution consisting of the copper-based particles, the reducing agent, the solvent, and the binder resin;
(b) printing on or filling in the reducing agent-containing copper-based particle dispersion solution on a substrate in a predetermined shape to form a reducing agent-containing copper-based particle patterned layer; and
(c) firing the reducing agent-containing copper-based particle patterned layer in air, not in an inert gas atmosphere,
wherein the reducing agent is included in the content of 0.1 to 80 parts by weight, based on 100 parts by weight of the reducing agent-containing copper-based particle dispersion solution,
wherein the copper-based particles are cuprous oxide particles or mixtures of copper particles and cuprous oxide particles,
wherein the reducing agent added to the copper-based particles dispersion solution reduces cuprous oxide into copper when the copper-based particle patterned layer is fired in the air, thereby continuously supplying copper at an initial firing stage,
wherein the copper is fired faster due to the oxygen in the air than the speed at which copper is oxidized, thereby forming the electroconductive patterned copper layer in the air, and
wherein the firing is a thermal treatment process performed at 200 to 650° C.

* * * * *